United States Patent
Tan et al.

(10) Patent No.: US 7,639,013 B2
(45) Date of Patent: Dec. 29, 2009

(54) THERMAL CONTROLLING METHOD, MAGNETIC FIELD GENERATOR AND MRI APPARATUS

(75) Inventors: Fengshun Tan, Florence, SC (US); Weijun Shen, Florence, SC (US); Yihe Hua, Wuxi (CN); Liang Liu, Wuxi (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/777,611

(22) Filed: Jul. 13, 2007

(65) Prior Publication Data
US 2008/0048656 A1 Feb. 28, 2008

(30) Foreign Application Priority Data
Jul. 14, 2006 (CN) .................. 2006 1 0121228

(51) Int. Cl.
*G01V 3/00* (2006.01)
(52) U.S. Cl. .................. 324/319; 324/320; 335/302; 335/304
(58) Field of Classification Search .......... 324/319, 324/320; 335/302, 304, 306
See application file for complete search history.

(56) References Cited

U.S. PATENT DOCUMENTS

| | | | | |
|---|---|---|---|---|
| 3,325,757 | A * | 6/1967 | Gang | .......... 335/217 |
| 4,456,898 | A * | 6/1984 | Frischmann | .......... 335/217 |
| 6,275,128 | B1 | 8/2001 | Aoki et al. | |
| 6,297,634 | B1 | 10/2001 | Aoki | |
| 6,313,632 | B1 | 11/2001 | Aoki et al. | |
| 6,340,888 | B1 | 1/2002 | Aoki et al. | |
| 6,403,956 | B1 * | 6/2002 | Sinha | .......... 250/298 |
| 6,809,519 | B2 | 10/2004 | Higuchi | |
| 6,809,619 | B1 | 10/2004 | Xu et al. | |
| 6,967,551 | B2 * | 11/2005 | Natsumeda et al. | .......... 335/284 |
| 7,034,536 | B2 | 4/2006 | Higuchi | |
| 7,084,633 | B2 | 8/2006 | Aoki et al. | |
| 2005/0128036 | A1 | 6/2005 | Doi et al. | |

FOREIGN PATENT DOCUMENTS

CN 1626033 A 6/2005
JP 2000287950 10/2000

* cited by examiner

*Primary Examiner*—Louis M Arana
(74) *Attorney, Agent, or Firm*—Armstrong Teasdale LLP (57) ABSTRACT

With a view toward implementing a thermal controlling method for making reversible a temperature characteristic of a magnetic field generator using permanent magnets small in Hcj, a magnetic field generator whose temperature characteristic is reversible, using permanent magnets small in Hcj, and an MRI apparatus provided with such a magnetic field generator, there is provided a method for controlling the temperature of a magnetic field generator having a pair of disc-shaped permanent magnets whose magnetic poles opposite in polarity to each other are opposed to each other with spacing defined therebetween, and a yoke that forms return passes for magnetic fluxes of the permanent magnets, comprising the steps of raising the temperature from room temperature to a temperature higher than the room temperature, maintaining the temperature higher than the room temperature, and lowering the temperature from the temperature higher than the room temperature to the room temperature, whereby the temperature characteristics of the permanent magnets are made reversible.

7 Claims, 9 Drawing Sheets

Hcb/Br>=0.92

FIG. 9B
PRIOR ART

Hcb/Br<0.90

THERMAL CONTROLLING METHOD, MAGNETIC FIELD GENERATOR AND MRI APPARATUS

CROSS REFERENCE TO RELATED APPLICATIONS

This application claims the benefit of Chinese Application No. 200610121228.1 filed Jul. 14, 2006.

BACKGROUND OF THE INVENTION

The present invention relates to a thermal controlling method, a magnetic field generator and an MRI (Magnetic Resonance Imaging) apparatus, and more specifically to a method for controlling the temperature of a permanent magnet-type magnetic field generator, a permanent magnet-type magnetic field generator, and an MRI apparatus provided with such a magnetic field generator.

An MRI apparatus acquires a magnetic resonance signal under a magnetic field generated by a magnetic field generator and reconstructs an image, based on the magnetic resonance signal. As one apparatus of the magnetic field generator, there is known one using permanent magnets. A pair of disc-shaped permanent magnets whose magnetic poles opposite in polarity to each other are opposed to each other with spacing defined therebetween is used in such a magnetic field generator. As the permanent magnet, a magnet composed of an Nd—Fe—B alloy, i.e., a Neodymium magnet is used.

A magnetic field strength of the magnetic field generator varies depending upon ambient temperatures on the basis of the temperature characteristics of the permanent magnets. Therefore, the magnetic field generator is used in a state in which its temperature is being raised to a temperature higher than room temperature, thereby to avoid the influence of a change in room temperature (refer to, for example, a Patent Document 1).

[Patent Document 1] Japanese Unexamined Patent Publication No. 2000-287950

Figure 8A:
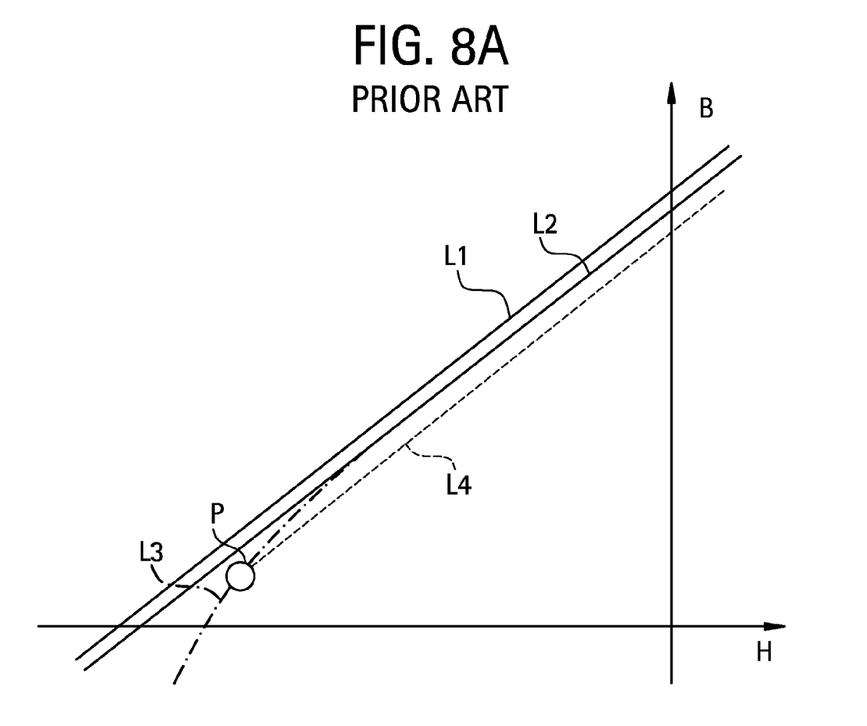
FIGS. 8(a) and 8(b) are diagrams illustrating BH curves of a permanent magnet.

BH curves of a permanent magnet vary with temperature. As shown in FIG. 8(a), for example, a BH curve given by a linear curve L1 at a temperature T1 results in a linear curve L2 parallel-moved downward at a temperature T2 (>T1). This change is reversible and the BH curve is restored to the linear curve L1 if the temperature is returned to T1.

However, the BH curve at the temperature T2 becomes partly non-linear as indicated by a dashed line L3. When an operating point P of the permanent magnet is placed on such a non-linear region, the BH curve is not returned to the linear curve L1 even though the temperature is restored to T1. This is because the operating BH curve at the temperature T2 results in a linear curve L4 parallel-moved further down as indicated by a broken line L4.

Figure 8B:
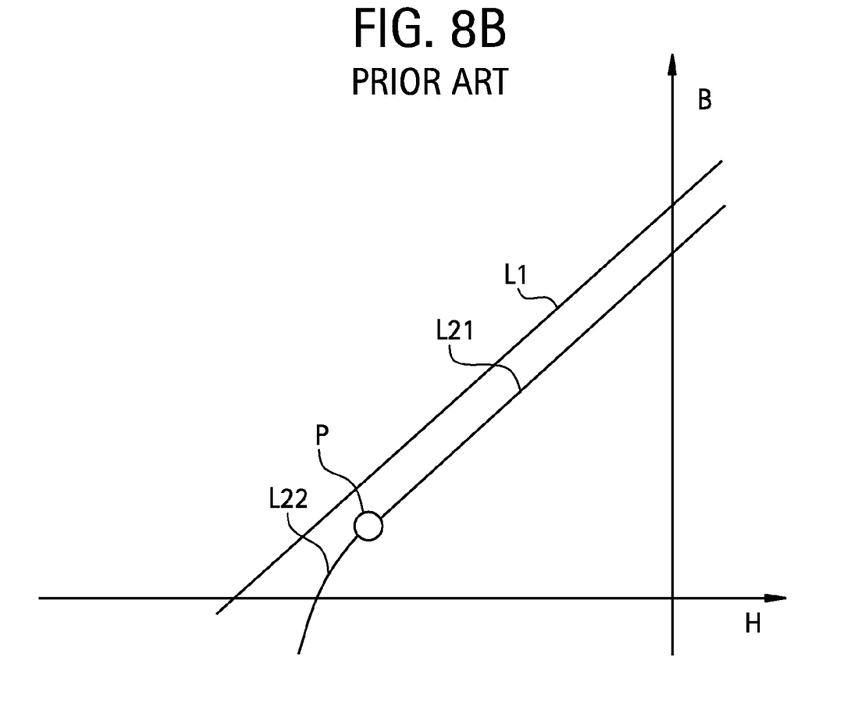

On the other hand, when the operating point P of the permanent magnet is placed on a linear region L21 even where the BH curve at the temperature T2 has a non-linear region L22 as shown in FIG. 8(b), the BH curve is restored to a linear curve L1 if the temperature is returned to T1. That is, the temperature characteristic of the permanent magnet is made reversible when the operating point is placed on the linear region of the BH curve, whereas when the operating point is placed on the non-linear region of the BH curve, the temperature characteristic thereof is rendered irreversible.

The operating point of the permanent magnet is determined depending upon demagnetization. The smaller the demagnetization, the higher the operating point (the higher the magnetic flux density). The larger the demagnetization, the lower the operating point (the lower the magnetic flux density). As the operating point becomes high (demagnetization becomes small), it is easy to fall into the linear region. As the operating point becomes low (demagnetization becomes large), it is easy to fall into the non-linear region.

Figure 9A:
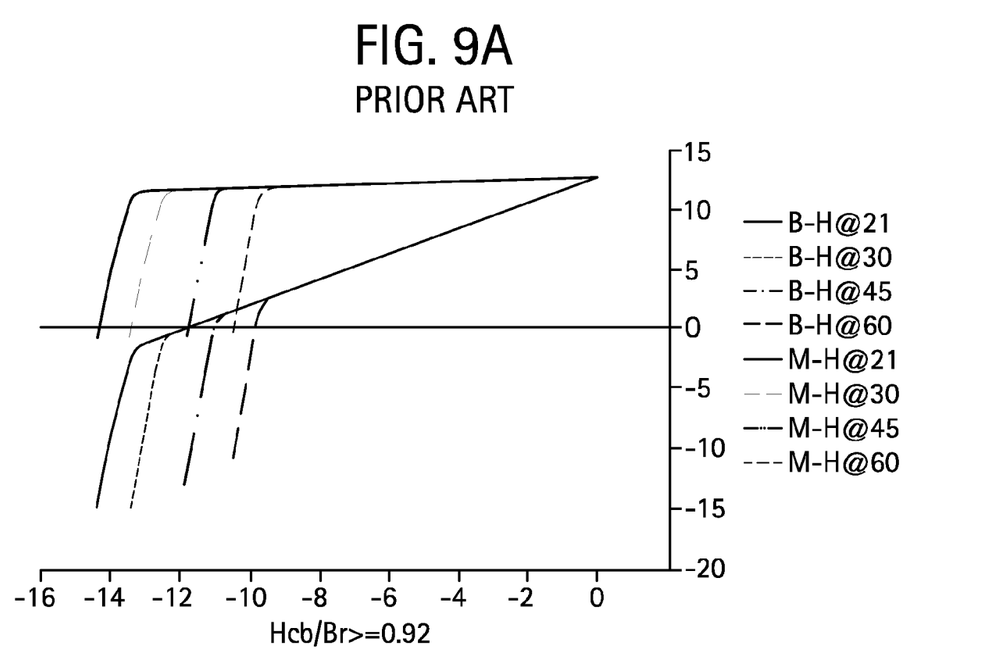
FIGS. 9(a) and 9(b) are diagrams showing BH curves of a permanent magnet.
Figure 9B:
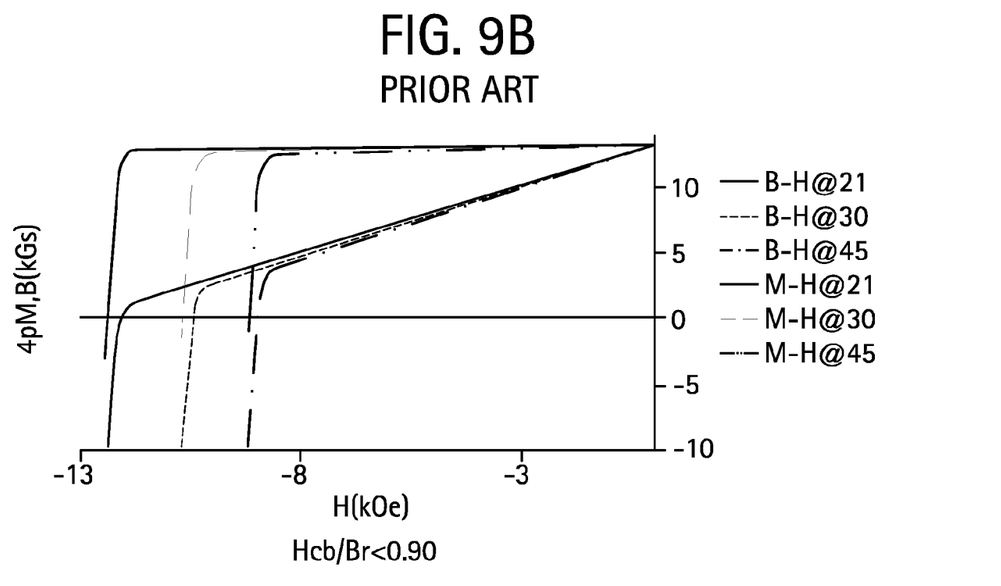

A non-linear region is small at a magnet large in Hcb/Br and Hcj (thus a linear region is large). A non-linear region is large at a magnet small in Hcb/Br and Hcj (thus a linear region is small). They will be shown in FIGS. 9(a) and 9(b) respectively. In both figures, a graph having a slope corresponds to a BH curve, and a slope-free curve corresponds to a JH curve. Incidentally, Hcb indicates retentivity as to a magnetic flux density B, Br indicates residual magnetism, and Hcj indicates retentivity as to magnetization J. Since Hcj is also large when Hcb/Br is large, Hcb/Br is typified by Hcj below.

The magnet large in Hcj may preferably be used to make the temperature characteristic reversible. However, such a magnet becomes extremely expensive because it contains Dysprosium corresponding to a rare element. On the other hand, the magnet small in Hcj is relatively low in cost because it does not contain Dysprosium.

SUMMARY OF THE INVENTION

Therefore, an object of the invention is to provide a thermal controlling method for making reversible a temperature characteristic of a magnetic field generator using permanent magnets small in Hcj, a magnetic field generator whose temperature characteristic is reversible, using permanent magnets small in Hcj, and an MRI apparatus equipped with such a magnetic field generator.

The invention according to one aspect, for solving the above problem is a method for controlling a temperature of a magnetic field generator having a pair of disc-shaped permanent magnets whose magnetic poles opposite in polarity to each other are opposed to each other with spacing defined therebetween, and a yoke which forms return passes for magnetic fluxes of the permanent magnets, comprising the steps of raising the temperature from a room temperature to a temperature higher than the room temperature, maintaining the temperature higher than the room temperature, lowering the temperature from the temperature higher than the room temperature to the room temperature, and making temperature characteristics of the permanent magnets reversible.

Each of the permanent magnets may preferably operate in a non-linear region of a BH curve in that it may be a magnet small in Hcj.

Preferably, the temperature raising step has a first temperature rise step for raising the temperature from the room temperature to 35° C., and a second temperature rise step for raising the temperature from 35° C. to 45° C., the temperature lowering step has a first temperature fall step for lowering the temperature from 45° C. to 35° C., and a second temperature fall step for lowering the temperature from 35° C. to the room temperature, and the temperature maintaining step has a first maintenance step for maintaining a temperature of 35° C. over two hours after the first temperature rise step, a second maintenance step for maintaining a temperature of 45° C. over two hours after the second temperature rise step, and a third maintenance step for maintaining the temperature of 35° C. over one hour after the first temperature fall step, in that reversibility of the temperature characteristic of the magnetic field generator is improved.

The room temperature may preferably range from 10° C. to 25° C. in that validity is obtained.

The temperature controlling may preferably be performed prior to shimming of a magnetic field in that workability is good.

The invention according to another aspect, for solving the above problem is a magnetic field generator comprising a pair of disc-shaped permanent magnets whose magnetic poles opposite in polarity to each other are opposed to each other with spacing defined therebetween, and a yoke which forms return passes for magnetic fluxes of the permanent magnets, wherein each of the permanent magnets includes a first portion relatively large in demagnetization, which is constituted of a magnetic material relatively large in Hcj, and a second portion relatively small in demagnetization, which is constituted of a magnetic material relatively small in Hcj.

The invention according to a further aspect, for solving the above problem is an MRI apparatus comprising a magnetic field generator including a pair of disc-shaped permanent magnets whose magnetic poles opposite in polarity to each other are opposed to each other with spacing defined therebetween, a yoke which forms return passes for magnetic fluxes of the permanent magnets, gradient magnetic field coils, and RF coils, wherein each of the permanent magnets includes a first portion relatively large in demagnetization, which is constituted of a magnetic material relatively large in Hcj, and a second portion relatively small in demagnetization, which is constituted of a magnetic material relatively small in Hcj.

Preferably, the first portion is a peripheral edge portion of the permanent magnet, and the second portion is a portion located inside of the peripheral edge portion of the permanent magnet in that adaptability to a demagnetization strength is good.

Each of the permanent magnets is preferably an Nd—Fe—B magnet in that its performance is good.

Each of the permanent magnets preferably has a pole piece smaller than a magnetic face thereof in area in that magnetic field uniformity is improved.

EFFECTS OF THE INVENTION

According to the invention related to one aspect, the thermal controlling method is a method for controlling a temperature of a magnetic field generator having a pair of disc-shaped permanent magnets whose magnetic poles opposite in polarity to each other are opposed to each other with spacing defined therebetween, and a yoke which forms return passes for magnetic fluxes of the permanent magnets, comprising the steps of raising the temperature from a room temperature to a temperature higher than the room temperature, maintaining the temperature higher than the room temperature, lowering the temperature from the temperature higher than the room temperature to the room temperature, and making temperature characteristics of the permanent magnets reversible. It is therefore possible to implement a thermal controlling method which makes reversible the temperature characteristic of a magnetic field generator using permanent magnets small in Hcj.

According to the invention related to another aspect, the magnetic field generator is a magnetic field generator comprising a pair of disc-shaped permanent magnets whose magnetic poles opposite in polarity to each other are opposed to each other with spacing defined therebetween, and a yoke which forms return passes for magnetic fluxes of the permanent magnets, wherein each of the permanent magnets includes a first portion relatively large in demagnetization, which is constituted of a magnetic material relatively large in Hcj, and a second portion relatively small in demagnetization, which is constituted of a magnetic material relatively small in Hcj. It is therefore possible to realize a magnetic field generator whose temperature characteristic is reversible, using permanent magnets small in Hcj.

According to the invention related to yet another aspect, the MRI apparatus is an MRI apparatus comprising a magnetic field generator including a pair of disc-shaped permanent magnets whose magnetic poles opposite in polarity to each other are opposed to each other with spacing defined therebetween, a yoke which forms return passes for magnetic fluxes of the permanent magnets, gradient magnetic field coils, and RF coils, wherein each of the permanent magnets includes a first portion relatively large in demagnetization, which is constituted of a magnetic material relatively large in Hcj, and a second portion relatively small in demagnetization, which is constituted of a magnetic material relatively small in Hcj. It is therefore possible to implement an MRI apparatus equipped with a magnetic field generator whose temperature characteristic is reversible, using permanent magnets small in Hcj.

Further objects and advantages of the present invention will be apparent from the following description of the preferred embodiments of the invention as illustrated in the accompanying drawings.

DETAILED DESCRIPTION OF THE INVENTION

Figure 1:
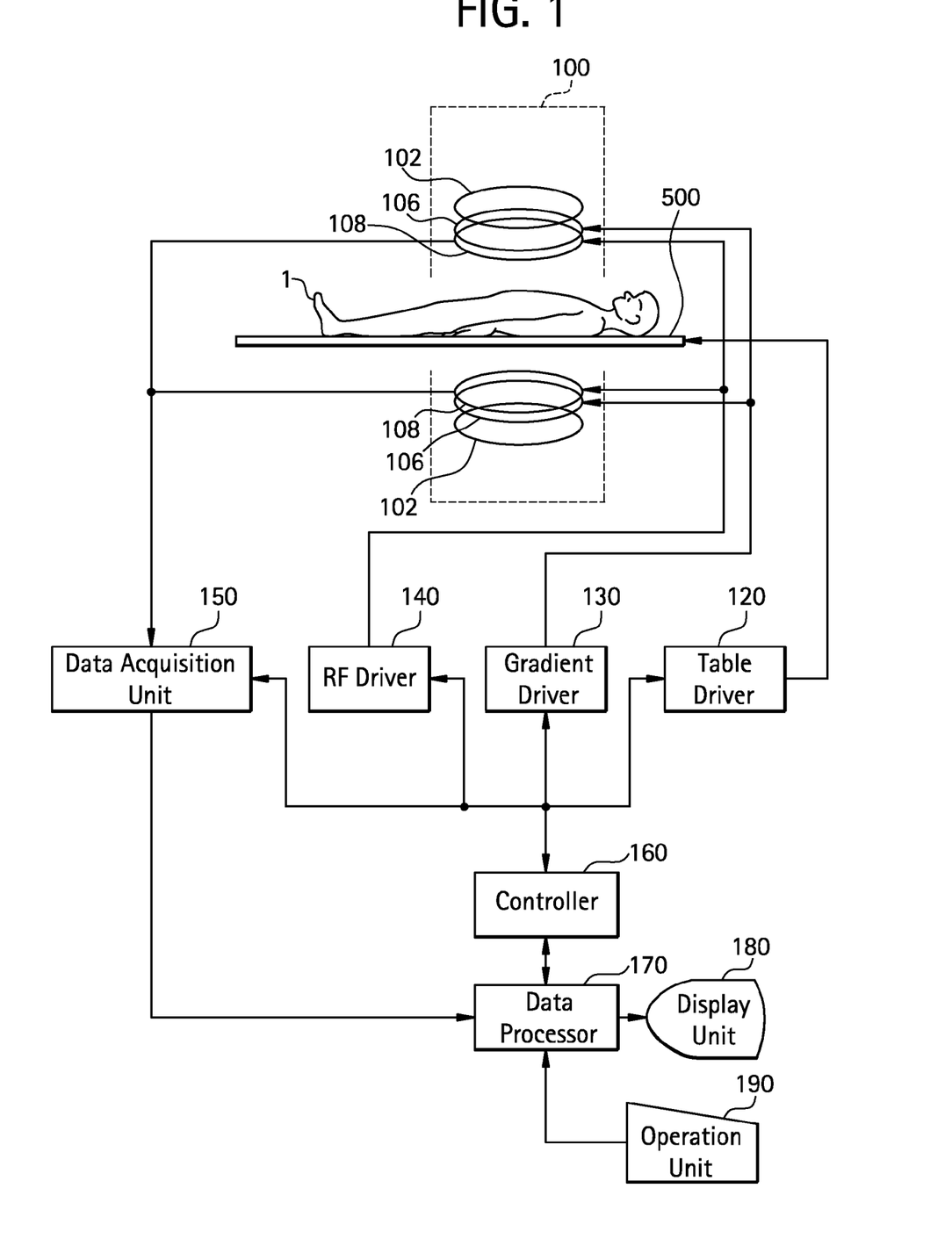
FIG. 1 is a block diagram of an MRI apparatus showing one example of the best mode for carrying out the invention.

A best mode for carrying out the invention will hereinafter be explained in detail with reference to the figures. Incidentally, the present invention is not limited to the best mode for carrying out the invention. A block diagram of an MRI apparatus is shown in FIG. 1. The present apparatus is one example of the best mode for carrying out the invention. One example of the best mode for carrying out the invention related to the MRI apparatus is shown according to the construction of the present apparatus.

As shown in FIG. 1, the present apparatus has a magnetic field generator 100. The magnetic field generator 100 has main magnetic field magnet units 102, gradient coil units 106 and RF (radio frequency) coil units 108.

Any of the main magnetic field magnet units 102, gradient coil units 106 and RF coil units 108 comprises paired ones opposed to one another with a space interposed therebetween. Further, any of them has a substantially disc shape and is placed with its central axis held in common. Each of the gradient coil units 106 is one example of a gradient magnetic field coil employed in the invention. Each of the RF coil unit 108 is one example of an RF coil employed in the invention.

A target 1 is placed on a table 500 in an internal bore of the magnetic field generator 100 and carried in and out. The table 500 is driven by a table driver 120.

Each of the main magnetic field magnet units 102 forms a static magnetic field in the internal bore of the magnetic field generator 100. The direction of the static magnetic field is approximately orthogonal to the direction of a body axis of the target 1. That is, each of the main magnetic field magnet units 102 forms a so-called vertical magnetic field. Each of the main magnetic field magnet units 102 is configured using a permanent magnet.

The gradient coil units 106 produce three gradient magnetic fields for respectively causing the intensities of static magnetic fields to have gradients or slopes in the directions of three axes vertical to one another, i.e., a slice axis, a phase axis and a frequency axis. Each of the gradient coil units 106 has unillustrated 3-systematic gradient coils in association with the three gradient magnetic fields.

Each of the RF coil units 108 transmits an RF pulse (radio frequency pulse) for exciting a spin in a body of the target 1 to a static magnetic field space. Further, the RF coil unit 108 receives therein a magnetic resonance signal which produces the excited spin. The RF coil units 108 may perform transmission and reception by either the same coil or discrete coils.

A gradient driver 130 is connected to the gradient coil units 106. The gradient driver 130 supplies a drive signal to each of the gradient coil units 106 to generate a gradient magnetic field. The gradient driver 130 has unillustrated 3-systematic drive circuits in association with the 3-systematic gradient coils in the gradient coil unit 106.

An RF driver 140 is connected to the RF coil units 108. The RF driver 140 supplies a drive signal to each of the RF coil units 108 to transmit an RF pulse, thereby exciting the spin in the body of the target 1.

A data acquisition unit 150 is connected to each of the RF coil units 108. The data acquisition unit 150 takes in or captures signals received by the RF coil units 108 by sampling and collects or acquires the same as digital data.

A controller 160 is connected to the table driver 120, the gradient driver 130, the RF driver 140 and the data acquisition unit 150. The controller 160 controls the table driver 120 to data acquisition unit 150 respectively to execute shooting or imaging.

The controller 160 is configured using a computer or the like, for example. The controller 160 has a memory. The memory stores a program and various data for the controller 160 therein. The function of the controller 160 is implemented by allowing the computer to execute the program stored in the memory.

The output side of the data acquisition unit 150 is connected to a data processor 170. The data acquired by the data acquisition unit 150 is inputted to the data processor 170. The data processor 170 is configured using a computer or the like, for example. The data processor 170 has a memory. The memory stores a program and various data for the data processor 170 therein.

The data processor 170 is connected to the controller 160. The data processor 170 ranks ahead of the controller 160 and generally controls it. The function of the present apparatus is implemented by allowing the data processor 170 to execute the program stored in the memory.

The data processor 170 causes the memory to store the data captured by the data acquisition unit 150. A data space is defined in the memory. The data space forms a Fourier space. The Fourier space is also called "k-space". The data processor 170 transforms data in the k-space into inverse Fourier form to thereby reconstruct an image for the target 1.

A display unit 180 and an operation or control unit 190 are connected to the data processor 170. The display unit 180 comprises a graphic display or the like. The operation unit 190 comprises a keyboard or the like provided with a pointing device.

The display unit 180 displays a reconstructed image and various information outputted from the data processor 170. The operation unit 190 is operated by an operator and inputs various commands and information or the like to the data processor 170. The operator is able to control the present apparatus on an interactive basis through the display unit 180 and the operation unit 190.

Figure 2:
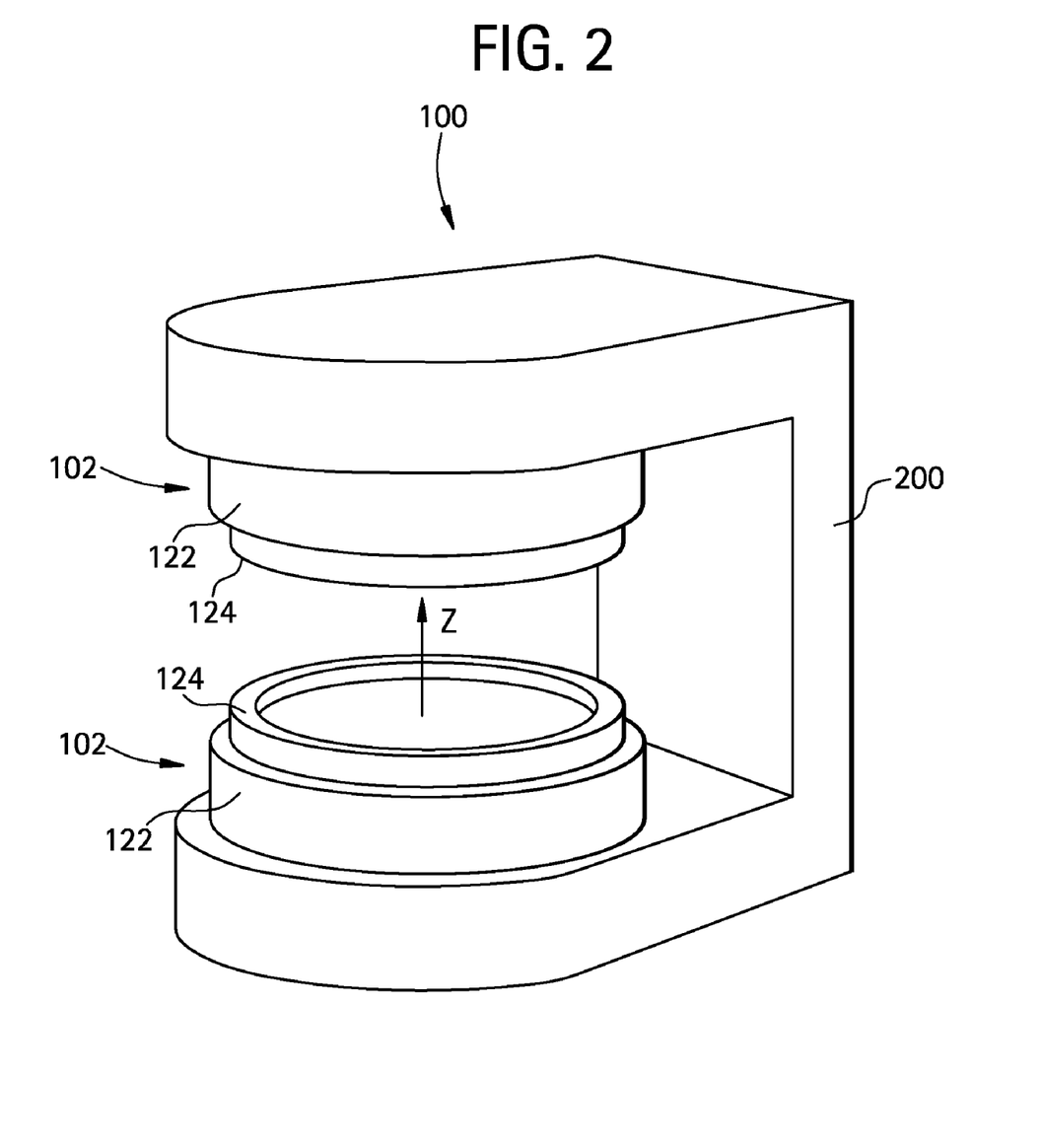
FIG. 2 is a diagram illustrating the construction of a magnetic field generator.

An outer appearance of one example of the magnetic field generator 100 is shown in FIG. 2 by a perspective view. The magnetic field generator 100 is one example of the best mode for carrying out the invention. One example of the best mode for carrying out the invention related to the magnetic field generator is shown according to the construction of the magnetic field generator 100. The magnetic field generator 100 is also one example of a magnetic field generator according to the invention.

As shown in FIG. 2, the magnetic field generator 100 includes a pair of main magnetic field magnet units 102 supported by a yoke 200. Each of the main magnetic field magnet units 102 is one example of a permanent magnet employed in the invention. The yoke 200 is one example of a yoke employed in the invention.

The main magnetic field magnet units 102 respectively have substantially disc-shaped or short cylindrical outer shapes. The yoke 200 forms return passes used for the pair of main magnetic field magnet units 102 and is constituted of a ferromagnetic material such as soft iron in a substantially C form. Incidentally, the shape of the yoke 200 is not limited to the C form.

The pair of main magnetic field magnet units 102 is supported in parallel and coaxially in such a manner that magnetic poles opposite in polarity to each other are opposed to each other. Thus, a vertical magnetic field is formed between both magnetic poles. The direction of the magnetic field is assumed to be a z direction below. While the pair of gradient coil units 106 and the pair of RF coil units 108 are respectively provided over magnetic pole faces of the pair of main magnetic field magnet units 102, their illustrations are omitted.

Each of the main magnetic field magnet units 102 comprises a permanent magnet 122 and a pole piece 124. The permanent magnet 122 is a magnet composed of an Nd—Fe—B alloy, i.e., a Neodymium magnet. The Neodymium magnet does not contain a rare element like dysprosium and is a magnet relatively small in Hcj.

The pole piece 124 is made up of soft iron. The diameter of the pole piece 124 is smaller than the diameter of the magnetic pole face of the main magnetic field magnet unit 102. That is, the permanent magnet 122 has a pole piece smaller in area than its magnetic pole face.

Figure 3:
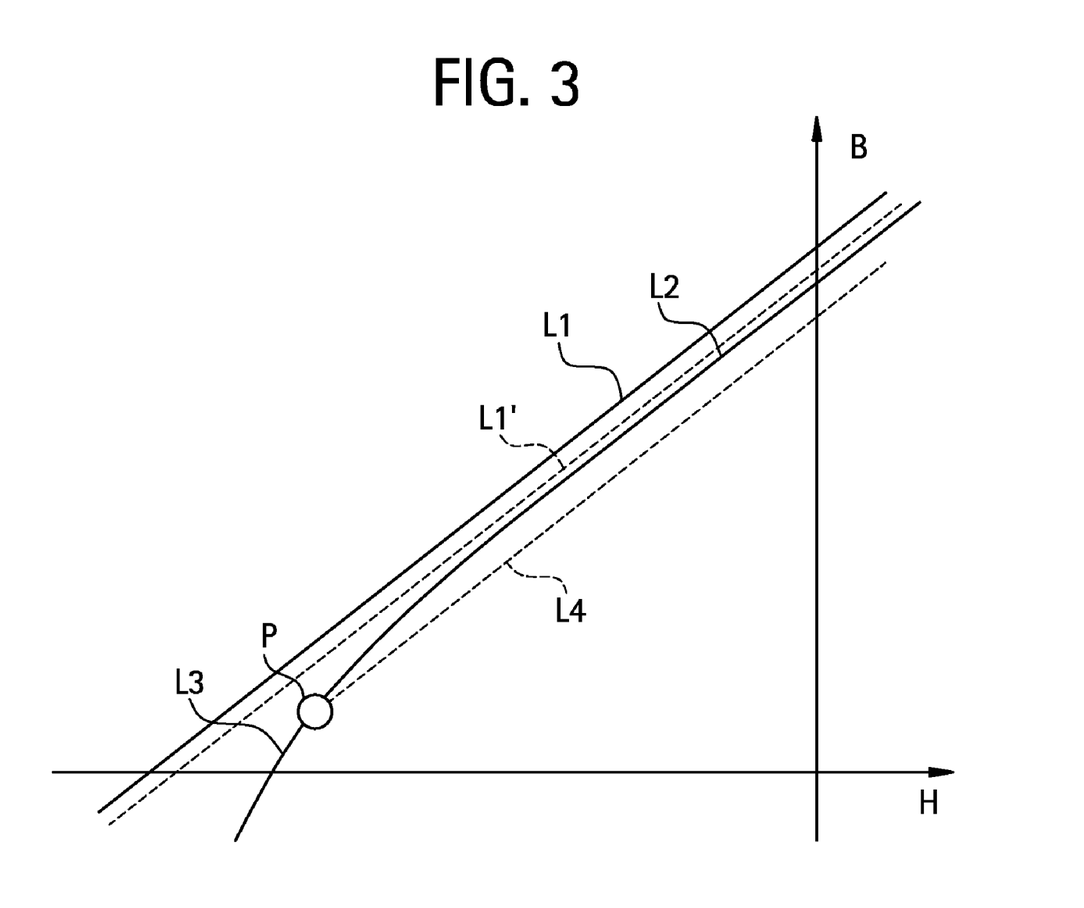
FIG. 3 is a diagram depicting BH curves of a permanent magnet.

BH curves of the permanent magnet 122 are shown in FIG. 3. As shown in FIG. 3, the BH curve is given by a linear curve L1 at a temperature T1, whereas the BH curve results in a combination of a linear curve L2 parallel-moved downwardly and a non-linear curve L3 at a temperature T2 (>T1).

An operating point P of the permanent magnet 122 is placed on the non-linear curve L3. Thus, an operating BH curve at the temperature T2 results in a linear curve L4 parallel-moved further down as indicated by a broken line L4.

Returning the temperature to Ti from this state yields the BH curve as a broken line L1'. The broken line L1' is parallel to the linear curve L1 but becomes a linear curve displaced in position. When, however, the temperature is raised to T2 again and is returned to T1, the BH curve is restored to the broken line L1'. This is the same no matter how many times it is repeated.

That is, after a temperature history of T1-T2-T1 is passed one cycle, the BH curve at the temperature T1 reaches the broken line L1' no matter how many times the same cycle is repeated. Thus, once the temperature history of T1-T2-T1 is made, the temperature characteristic of the permanent magnet 122 assumes reversibility. Utilizing this phenomenon enables reversing of the temperature characteristic of the magnetic field generator using the permanent magnets small in Hcj.

Figure 4:
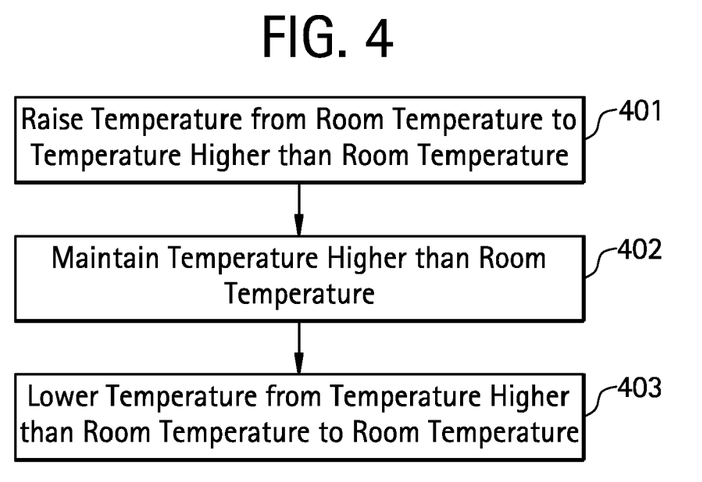
FIG. 4 is a diagram showing a process of thermal controlling.

A process for reversing the temperature characteristic is shown in FIG. 4. The present process is one example of the best mode for carrying out the invention. One example of the best mode for carrying out the invention related to a thermal controlling method is shown based on the present process.

As shown in FIG. 4, the temperature is raised from room temperature to a temperature higher than it at Step S401. At Step S402, the temperature higher than the room temperature is maintained. At Step S403, the temperature is lowered from the temperature higher than the room temperature to the room temperature. The room temperature is equivalent to the temperature T1, and the temperature higher than the room temperature corresponds to the temperature T2. Incidentally, the room temperature ranges from 10° C. to 25° C., for example. Step S401 is one example of a temperature rise step according to the invention. Step S402 is one example of a maintenance step according to the invention. Step S403 is one example of a temperature fall step according to the invention.

Figure 5:
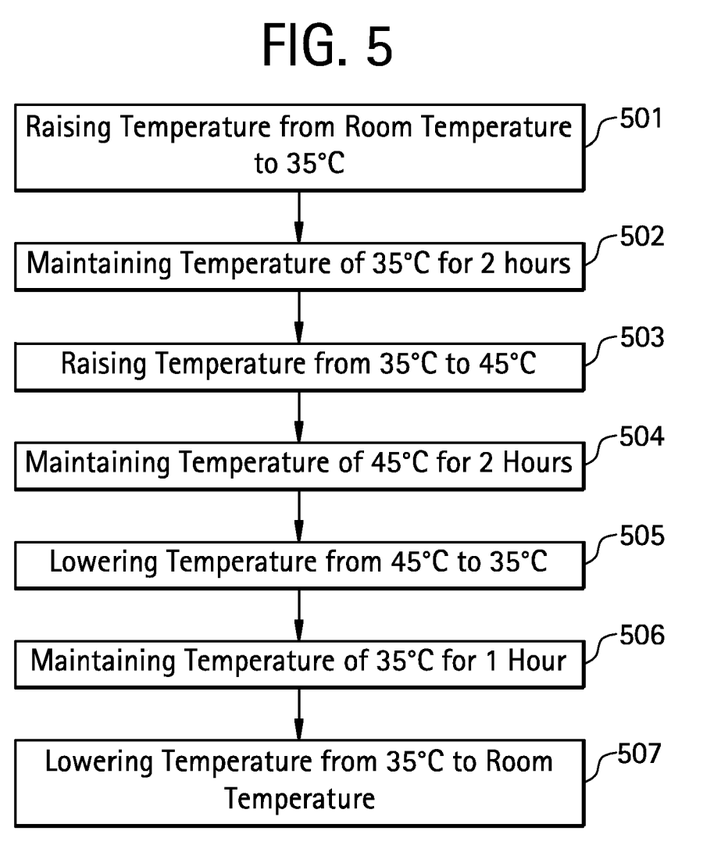
FIG. 5 is a diagram illustrating one example of a further detailed process of thermal controlling.

One example of a further detailed process of the thermal controlling is shown in FIG. 5. As shown in FIG. 5, the temperature is raised from the room temperature to 35° C. at Step S501, the temperature of 35° C. is maintained over two hours at Step S502, the temperature is raised from 35° C. to 45° C. at Step S503, the temperature of 45° C. is maintained over two hours at Step S504, the temperature is lowered from 45° C. to 35° C. at Step S505, the temperature of 35° C. is maintained over 1 hour at Step S506, and the temperature is lowered from 35° C. to the room temperature at Step S507.

Step S501 is one example of a first temperature rise step according to the invention. Step S502 is one example of a first maintenance step according to the invention. Step S503 is one example of a second temperature rise step according to the invention. Step S504 is one example of a second maintenance step according to the invention. Step S505 is one example of a first temperature fall step according to the invention. Step S506 is one example of a third maintenance step according to the invention. Step S507 is one example of a second temperature fall step according to the invention.

With such thermal controlling, the temperature characteristic of the magnetic field generator is reliably reversed. Incidentally, the thermal operation or controlling of the magnetic field generator may be performed before degree-of-uniformity control on a magnetic filed strength distribution, i.e., its shimming. Such thermal controlling may be carried out before shipment of a product when a maker executes it, whereas when a user performs it, such thermal controlling may be carried out upon its acceptance.

Figure 6A:
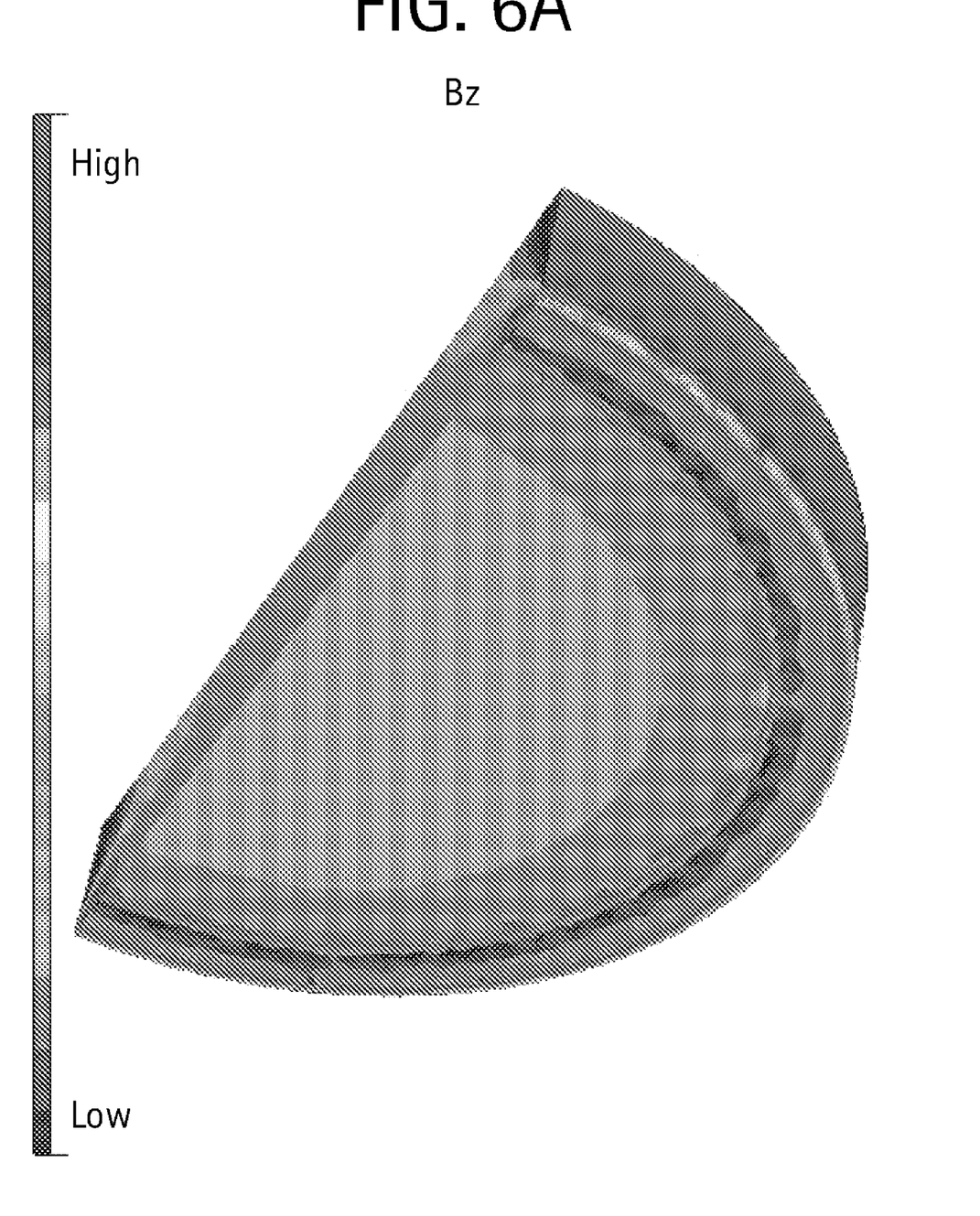
FIGS. 6(a) and 6(b) are diagrams showing a magnetic flux density distribution and a magnetic field strength distribution at a magnetic pole face of the permanent magnet.
Figure 6B:
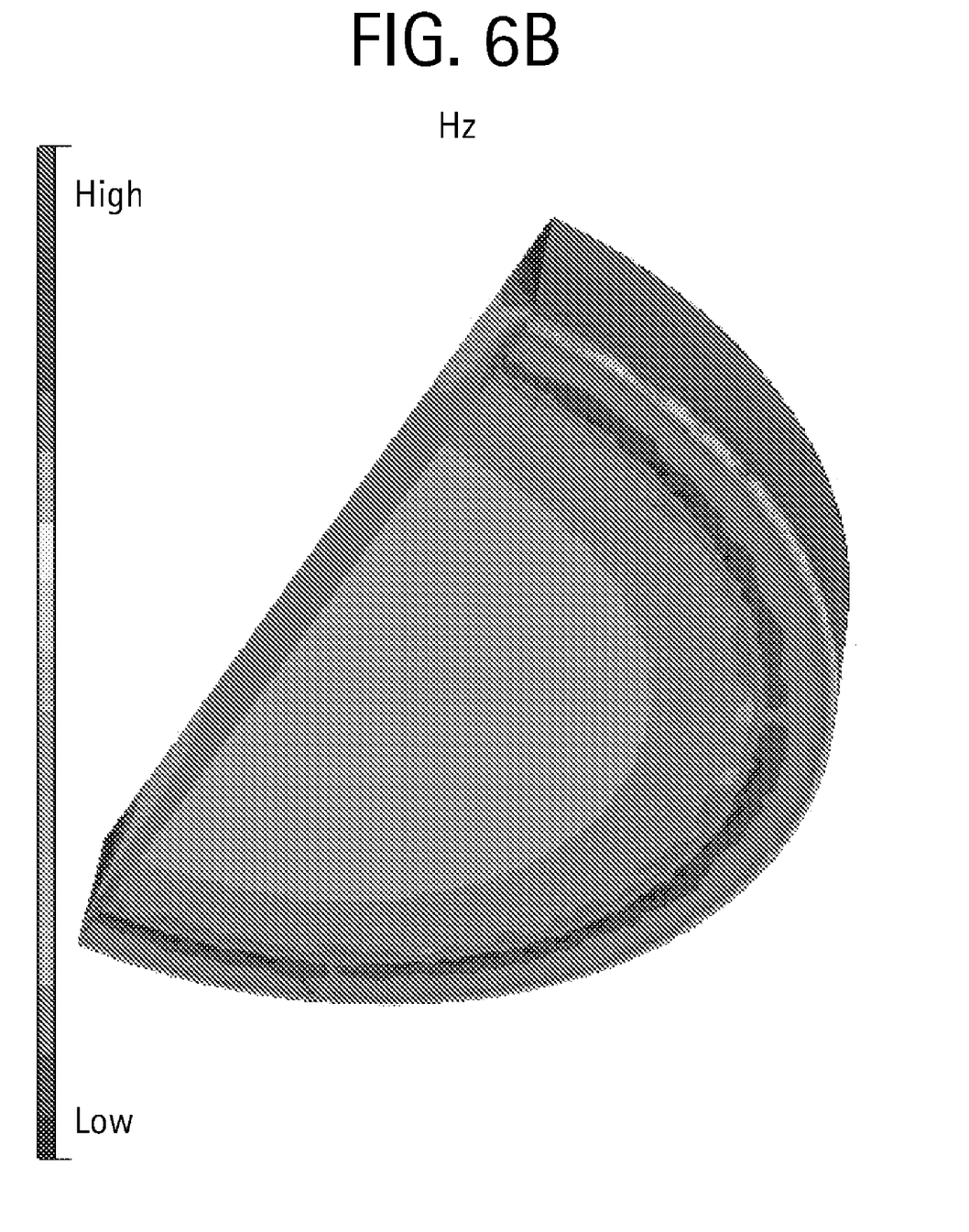

A magnetic flux density distribution and a magnetic field strength distribution at a magnetic pole face of each permanent magnet 122 are respectively shown in FIGS. 6(a) and 6(b). As shown in FIGS. 6(a) and 6(b), the peripheral edge portion of the permanent magnet 122 becomes lower than a portion located inside of it in magnetic flux density and magnetic filed strength. A portion low in magnetic flux density and magnetic field strength is equivalent to a portion low in operating point, i.e., a portion large in demagnetization. A portion high in magnetic flux density and magnetic field strength is equivalent to a portion high in operating point, i.e., a portion low in demagnetization.

Figure 7:
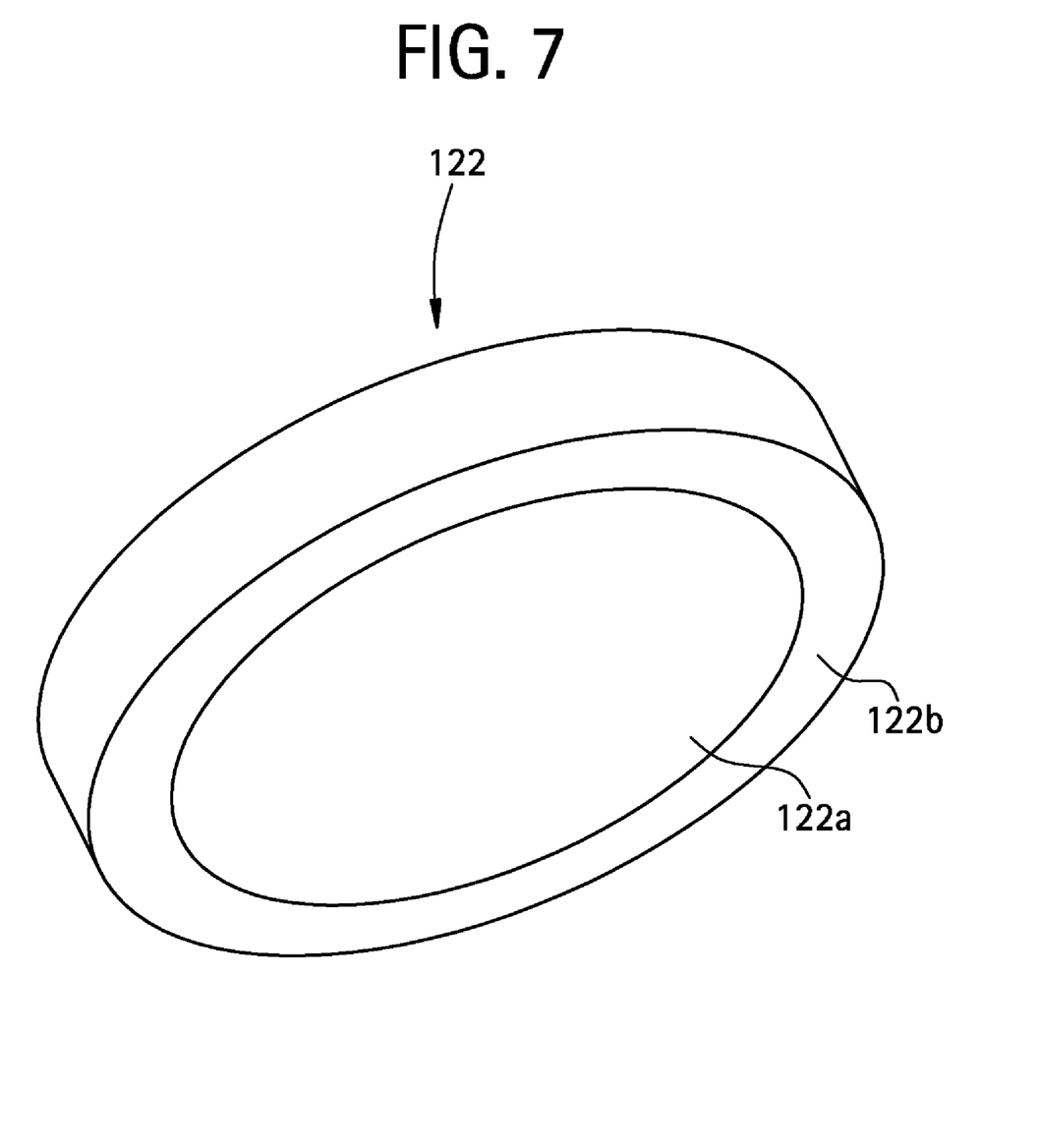
FIG. 7 is a diagram depicting the construction of the permanent magnet.

In view of such a magnetic state, the peripheral edge portion 122b is constituted of a magnet large in Hcj and the portion 122a located inside of it is constituted of a magnet small in Hcj, as shown in FIG. 7. By doing so, any operating point can be set so as to fall within a linear region of a BH curve.

This is because since the linear region of the BH curve is large although the operating point is low at the peripheral edge portion 122b large in Hcj, the operating point thereof exists in the linear region, whereas since the operating point is high at the inner portion 122a low in Hcj, the operating point thereof exists in the linear region even though the linear region of the BH curve is small.

Thus, the magnetic field generator 100 has a reversible temperature characteristic. Since, at this time, the most part of the permanent magnet 122 is made up of the magnet large in Hcj and only the peripheral edge portion is made up of the magnet large in Hcj, the permanent magnet 122 results in one much more inexpensive than when the whole part thereof is constituted of the magnet large in Hcj.

Many widely different embodiments of the invention may be configured without departing from the spirit and the scope of the present invention. It should be understood that the present invention is not limited to the specific embodiments described in the specification, except as defined in the appended claims.

The invention claimed is:

1. A method for controlling a temperature characteristic of a magnetic field generator having a pair of disc-shaped permanent magnets whose magnetic poles opposite in polarity to each other are opposed to each other with spacing defined therebetween, and a yoke which forms return passes for magnetic fluxes of the permanent magnets, said method comprising:

raising a temperature of the permanent magnets from a room temperature to a temperature higher than the room temperature;

maintaining the temperature of the permanent magnets at the temperature higher than the room temperature;

lowering the temperature of the permanent magnets from the temperature higher than the room temperature to the room temperature; and making temperature characteristics of the permanent magnets reversible.

2. The temperature characteristic controlling method according to claim 1, wherein said temperature characteristic controlling method is performed on a pair of disc-shaped permanent magnets.

3. The temperature characteristic controlling method according to claim 1, wherein the permanent magnets are Nd—Fe—B magnets.

4. The temperature characteristic controlling method according to claim 1, wherein the permanent magnets each have a pole piece smaller than a magnetic face thereof in area.

5. The temperature characteristic controlling method according to claim 1, wherein raising a temperature of the permanent magnets includes a first temperature rise step for raising the temperature of the permanent magnets from the room temperature to 35° C., and a second temperature rise step for raising the temperature of the permanent magnets from 35° C. to 45° C., wherein lowering the temperature of the permanent magnets includes a first temperature fall step for lowering the temperature of the permanent magnets from 45° C. to 35° C., and a second temperature fall step for lowering the temperature of the permanent magnets from 35° C. to the room temperature, and wherein maintaining the temperature of the permanent magnets includes a first maintenance step for maintaining the temperature of the permanent magnets at a temperature of 35° C. over two hours after the first temperature rise step, a second maintenance step for maintaining the temperature of the permanent magnets at a temperature of 45° C. over two hours after the second temperature rise step, and a third maintenance step for maintaining the temperature of the permanent magnets at the temperature of 35° C. over one hour after the first temperature fall step.

6. The temperature characteristic controlling method according to claim 1, wherein the room temperature ranges from 10° C. to 25° C.

7. The temperature characteristic controlling method according to claim 1, wherein said temperature characteristic controlling method is performed before shimming of a magnetic field.

* * * * *